US009077328B1

(12) United States Patent
Valliappan et al.

(10) Patent No.: US 9,077,328 B1
(45) Date of Patent: Jul. 7, 2015

(54) METHOD AND APPARATUS FOR REFERENCE-LESS REPEATER WITH DIGITAL CONTROL

(71) Applicant: Broadcom Corporation, Irvine, CA (US)

(72) Inventors: Magesh Valliappan, Austin, TX (US); Afshin Momtaz, Laguna Hills, CA (US); Namik Kocaman, San Clemente, CA (US); Vasudevan Parthasarathy, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/246,836

(22) Filed: Apr. 7, 2014

Related U.S. Application Data

(60) Provisional application No. 61/928,840, filed on Jan. 17, 2014.

(51) Int. Cl.
H04L 27/06 (2006.01)
H03K 5/26 (2006.01)
H04L 7/033 (2006.01)
H04B 7/155 (2006.01)

(52) U.S. Cl.
CPC ............... *H03K 5/26* (2013.01); *H04L 7/0331* (2013.01); *H04B 7/155* (2013.01)

(58) Field of Classification Search
CPC .................. H04L 27/2659; H04L 27/266
USPC .................................. 375/316, 344
See application file for complete search history.

(56) References Cited

U.S. PATENT DOCUMENTS

2010/0189198 A1* 7/2010 Eskin ........................... 375/340

* cited by examiner

Primary Examiner — Kevin Kim
(74) Attorney, Agent, or Firm — Sterne, Kessler, Goldstein & Fox P.L.L.C.

(57) ABSTRACT

Reference-less repeating circuits provide significant advantages over repeating circuits requiring external frequency references. These repeating circuits eliminate the need for external frequency references provide significant power, layout, and physical isolation advantages. Digitally controlled reference-less repeating circuits have a relatively narrow frequency detection range, but typically consume significantly less power than analog repeating circuits while providing data rate flexibility, particularly at lower data rates. Due to the narrow frequency detection range of digitally controlled reference-less repeating circuits, efficient frequency estimation techniques allow these circuits to quickly lock to an input signal, and provide an accurate repeated output signal.

20 Claims, 10 Drawing Sheets ial Application No. 61/928,840, filed Jan. 17, 2014, which
METHOD AND APPARATUS FOR REFERENCE-LESS REPEATER WITH DIGITAL CONTROL

CROSS-REFERENCE TO RELATED APPLICATION(S)

The present application claims the benefit of U.S. Provisional Application No. 61/928,840, filed Jan. 17, 2014, which is incorporated herein by reference in its entirety.

BACKGROUND

1. Field of the Disclosure

The disclosure generally relates to reference-less repeaters, including techniques to estimate a wide range of frequencies in a digital signal and propagate frequency information with digital control.

2. Related Art

Reference-less repeaters provide significant advantages over repeaters requiring external frequency references. Dedicated frequency references typically need additional components that require additional power, mounting, board space, and environmental requirements in order to operate in a stable and effective manner. Schemes to distribute a common frequency reference among a variety of circuits to minimize these issues impose further shielding and isolation requirements on reference signal distribution circuits and board traces. Therefore, retiming circuits that eliminate the need for external frequency references provide significant power, layout, and physical isolation advantages.

Current reference-less repeaters typically employ high-power analog-only solutions that while having a wide frequency detection range, also have difficulty adapting to oversampling. Furthermore, analog-only reference-less repeaters have difficulty transferring frequency information from one node to another, and adapting to lower data rates typically used for auto-negotiation. Analog-only retiming circuits typically employ analog frequency detectors that consume large amounts of power. Digitally controlled reference-less retiming circuits, on the other hand, have a relatively narrow frequency detection range, but typically consume significantly less power than analog retiming circuits. Furthermore, digitally controlled reference-less retiming circuits provide data rate flexibility, particularly at lower data rates. Due to the narrow frequency detection range of digitally controlled reference-less retiming circuits, frequency estimation allows these circuits to quickly determine the frequency of an input signal, and distribute the frequency information quickly and efficiently.

BRIEF DESCRIPTION OF THE DRAWINGS/FIGURES

Embodiments of the disclosure are described with reference to the accompanying drawings. In the drawings, like reference numbers indicate identical or functionally similar elements. Additionally, the left most digit(s) of a reference number identifies the drawing in which the reference number first appears.

Figure 1:
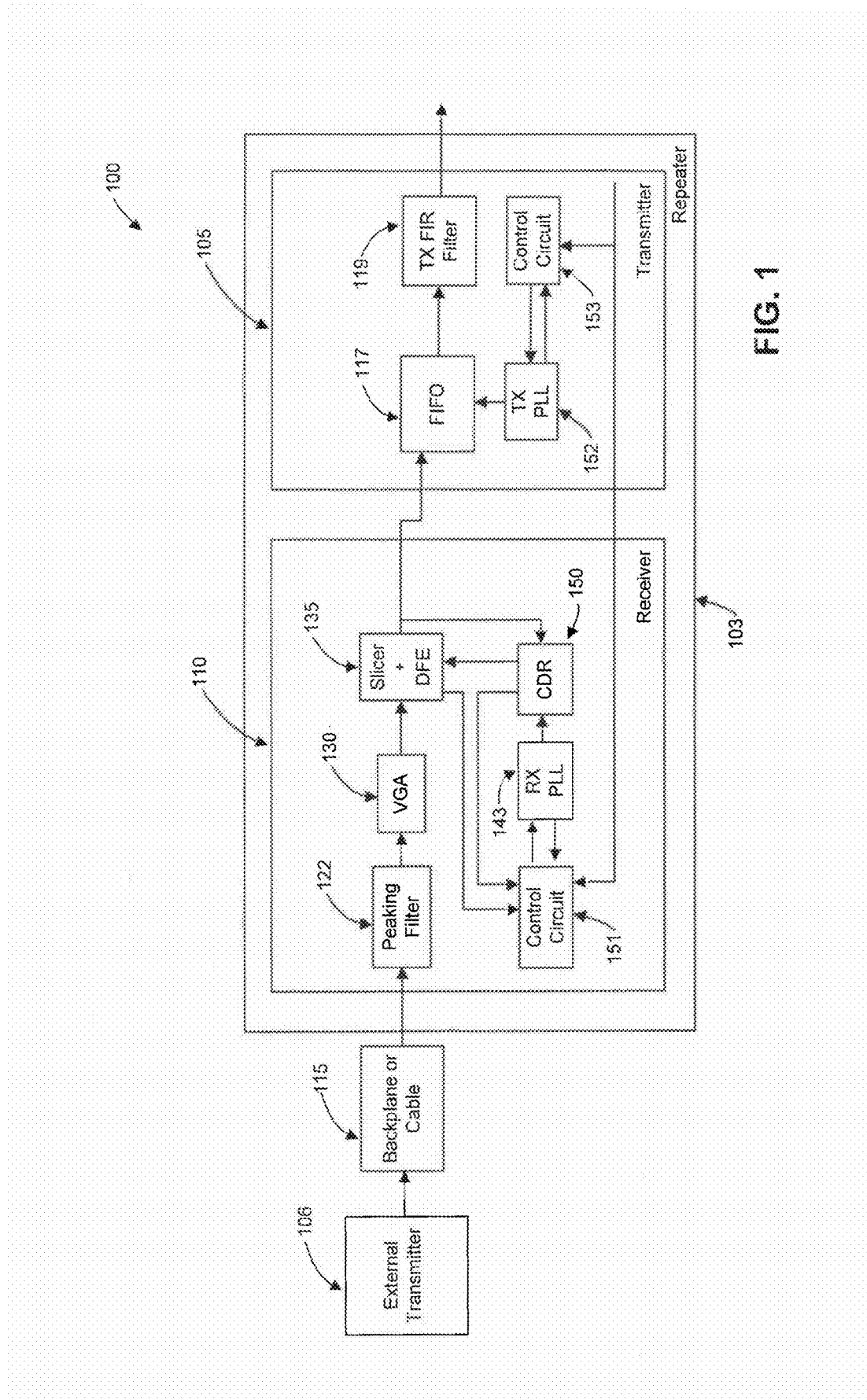
FIG. 1 illustrates a block diagram of a receiver/transmitter system according to an exemplary embodiment of the present disclosure.

Embodiments of the disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE DISCLOSURE

The following Detailed Description refers to accompanying drawings to illustrate exemplary embodiments consistent with the disclosure. References in the Detailed Description to "one exemplary embodiment" "an exemplary embodiment," "an example exemplary embodiment," etc., indicate that the exemplary embodiment described can include a particular feature, structure, or Characteristic, but every exemplary embodiment can not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

For purposes of this discussion, the term "module" shall be understood to include at least one of software, firmware, and hardware (such as one or more circuits, microchips, processors, or devices, or any combination thereof), and any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

FIG. 1 illustrates a block diagram of a communication system 100 including an external transmitter 106, a backplane or cable 115, and a repeater 103 including a receiver 110 and a transmitter 105. The external transmitter 106 generates a signal that is carried over the backplane or cable 115 and received by the receiver 110 within the repeater 103. The receiver 110 detects the frequency of the signal and propagates frequency information to the transmitter 105 that repeats the signal by transmitting the signal using the frequency information.

The receiver 110 includes a peaking filter 122 and a variable gain amplifier (VGA) 130 that together filter and amplify an incoming signal so that a control circuit 151 can estimate the frequency of the incoming signal. A receive PLL 143 utilizes the estimated frequency from the control circuit 151 to set a frequency of a clock signal provided to a clock data recovery (CDR) circuit 150. In another embodiment, PLL 143 is shared with the transmitter 105 so that either of transmit PLL 152 or receive PLL 143 can be eliminated. The incoming signal is equalized and then sliced by slicer and decision feedback equalizer (DFE) 135, and the resulting signal is provided to the CDR circuit 150. Utilizing the sliced and equalized incoming signal and the clock signal from the receive PLL 143, the CDR updates a sample point (i.e. phase of sampling time) for the slicer and DFE 135 in a feedback loop. Once the CDR 150 determines that an appropriate sample point for the slicer and DFE 135 has been established, the CDR 150 sends an indicator to the control circuit 151 to propagate the frequency information to the transmitter 105. In response to this indicator, control circuit 151 controls slicer and DFE 135 to for and its output to the transmitter 105.

The transmitter 105 includes a First In First Out (FIFO) buffer 117 that receives the output of slicer and DFE 135 and that provides the output to a transmit (TX) Finite Impulse Response (FIR) filter 119 according to a clock signal generated by a transmit PLL 152. A transmit control circuit 153 receives frequency information, for example in digital format, from the receive control circuit 151 and provides the frequency information to the transmit PLL 152. The transmit PLL 152, utilizing the frequency information from the transmit control circuit 153, generates the clock signal, for example, with a similar frequency of the clock signal generated with the receive PLL 143. Therefore, the transmit PCS 117 can encode the data using a clock signal similar to the clock signal utilized to extract the data in the receiver 110, without requiring the estimation circuitry included in the receiver 110.

Figure 2:
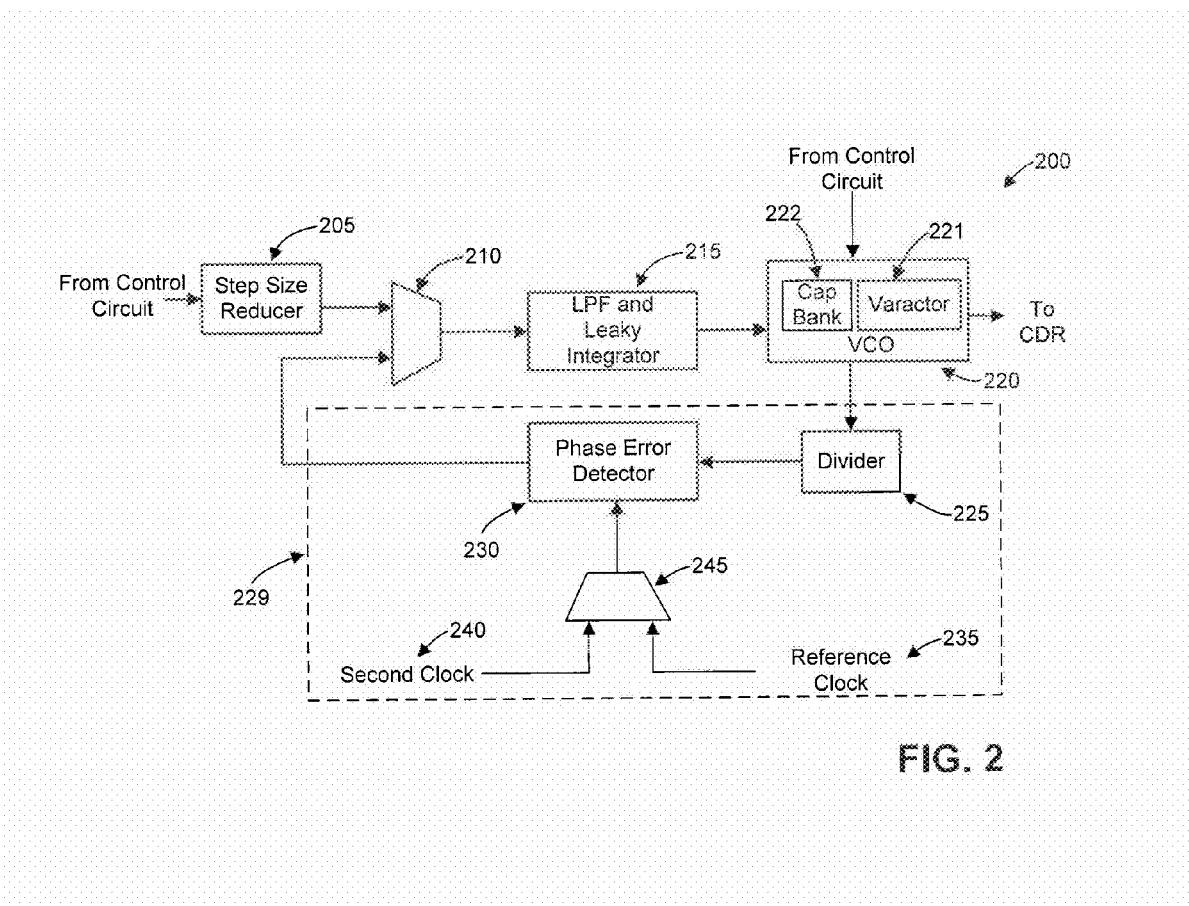
FIG. 2 illustrates a block diagram of an analog phase locked loop circuit according to an exemplary embodiment of the present disclosure.

FIG. 2 illustrates a block diagram of an analog phase locked loop circuit 200 that in some embodiments may correspond to the receive PLL 143 or transmit PLL 152 illustrated in FIG. 1. The PLL 200 includes a selector 210 that selects between a control circuit input from the control circuit 151 or 153 through a step size reducer 205, or an output of a phase error detector 230. When the selector 210 selects the control input from the control circuit 151 or 153, the control circuit 151 or 153 provides a set frequency value to the step size reducer 205. The step size reducer 205 implements a state machine that generates incremental frequency updates in the form of voltage control signals over time to the low-pass filter (LF) and leaky integrator 215. In the alternative, when the selector 210 selects the output of the phase error detector 230, the phase error detector 230 determines a phase error between a divided output, through a divider 225, of a VCO 220, and either of a reference clock 235 or second clock 240. The second clock 240 may for example consist of a clock signal from another desired receiver or transmitter.

The LPF and leaky integrator 215 receives the control signal from the selector 210 and low pass filters and integrates the control signal. In some embodiments, the leaky integrator 215 may drift if updates are not provided within a predefined time-period characteristic of the leaky integrator 215. The VCO 220 receives the filtered and integrated control signal and oscillates to provide a clock signal, that is output for example to the CDR 150, where the frequency of oscillation is based on a value of the control signal. The oscillating frequency of the VCO 220 may be coarse tuned based on selecting from one or more capacitor banks 222 within the VCO 220. The VCO 220 may be fine-tuned by using the control signal to tune a varactor 221 within the VCO 220. As such, the clock signal generated by the PLL can be updated and maintained through the control circuit 151 or 152, or through phase error detection of a provided reference clock 235 or second clock 240.

Figure 3A:
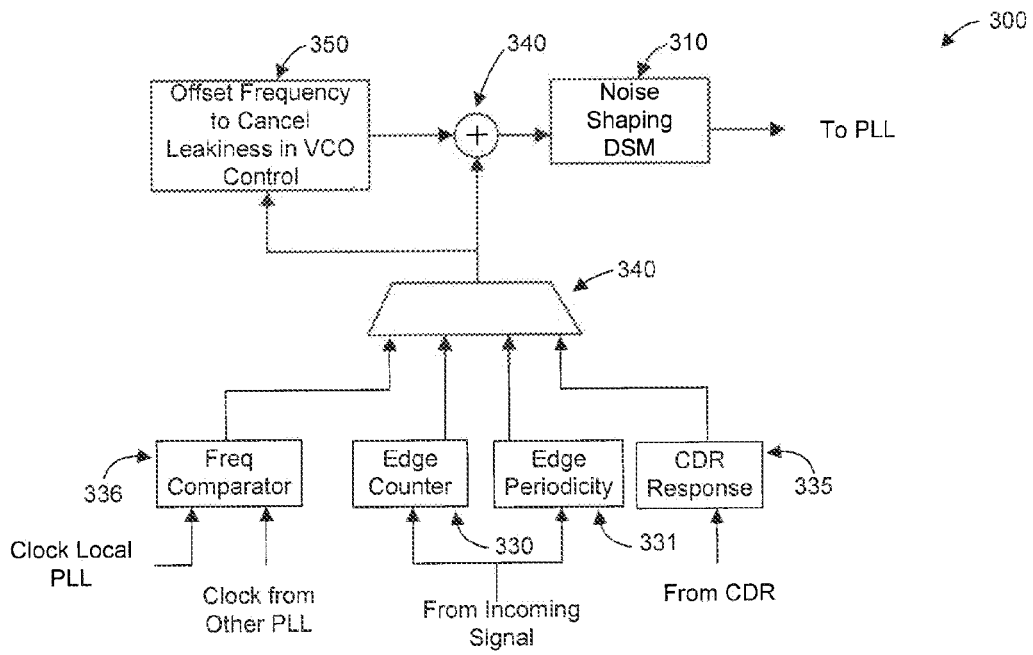
FIG. 3A illustrates a block diagram of a digital control circuit for a phase locked loop according to an exemplary embodiment of the present disclosure.

FIG. 3A illustrates a block diagram of a control circuit 300 for a phase locked loop. The control circuit 300 may be one embodiment of the receive control circuit 151 or the transmit control circuit 152 of FIG. 1. In some embodiments, the control circuit 300 may control the phase locked loop 143 and 152 of FIG. 1 and the phase locked loop 200 of FIG. 2.

The control circuit 300 includes a selector 340 that selects between four frequency estimation circuits, an edge counter circuit 330, an edge periodicity circuit 331, a CDR response circuit 335, and a frequency comparator circuit 336. The estimated frequency selected by the selector 340 is combined in a signal combiner 340 with an offset generated by an offset frequency generator 350 that generates frequency offsets to cancel leakiness, for example, in the leaky integrator 215 of FIG. 2. A noise shaping delta sigma modulator (DSM) 310 uses the offset frequency estimate and generates a frequency control signal used, for example, by the receive PLL 143 of FIG. 1 or the PLL 200 of FIG. 2.

Figure 4:
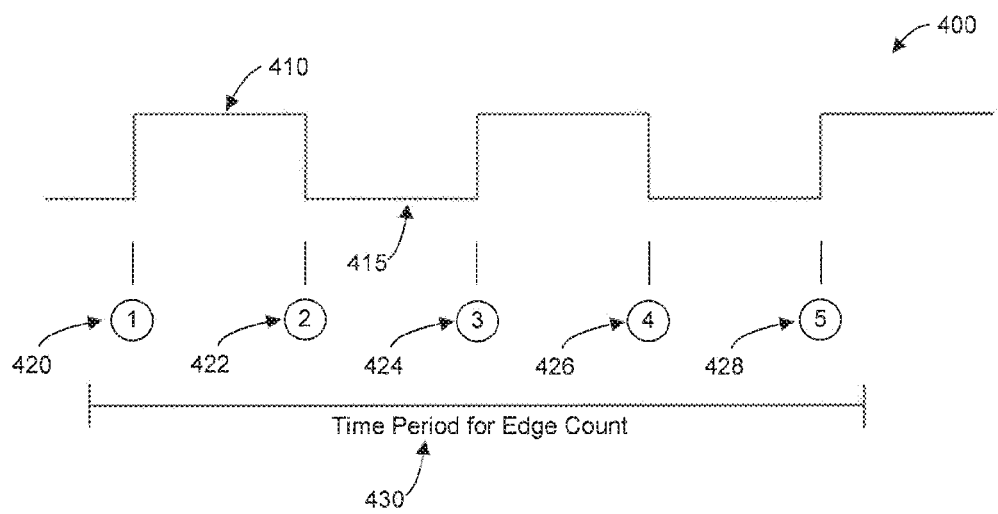
FIG. 4 illustrates an edge counting frequency estimation scheme according to an exemplary embodiment of the present disclosure.

The edge counter circuit 330 implements a frequency estimation scheme illustrated and described in FIG. 4, to estimate the frequency of an incoming signal, for example at the output of the VGA 130 of FIG. 1. The edge counter circuit 330 includes logic to estimate the frequency of the signal by counting a number of transitions within a given time period based on a priori knowledge of the transition density of the signal (e.g., is near 50 percent or other value). The transition density of a signal in a given time period is the ratio of the number transitions (or edges) to the number of bit intervals within the time period.

Figure 5:
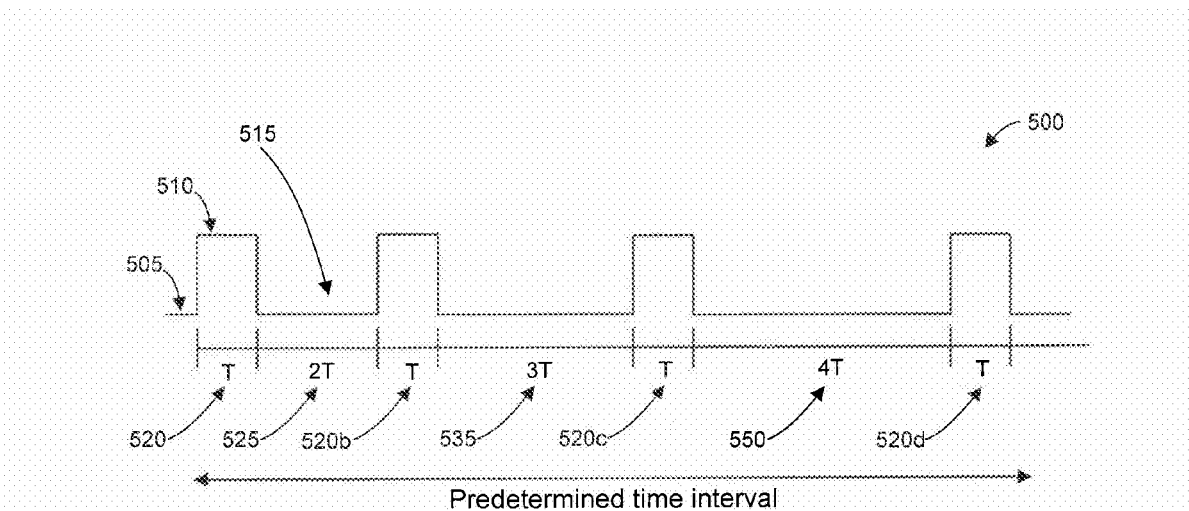
FIG. 5 illustrates an edge periodicity frequency estimation scheme according to an exemplary embodiment of the present disclosure.
Figure 6:
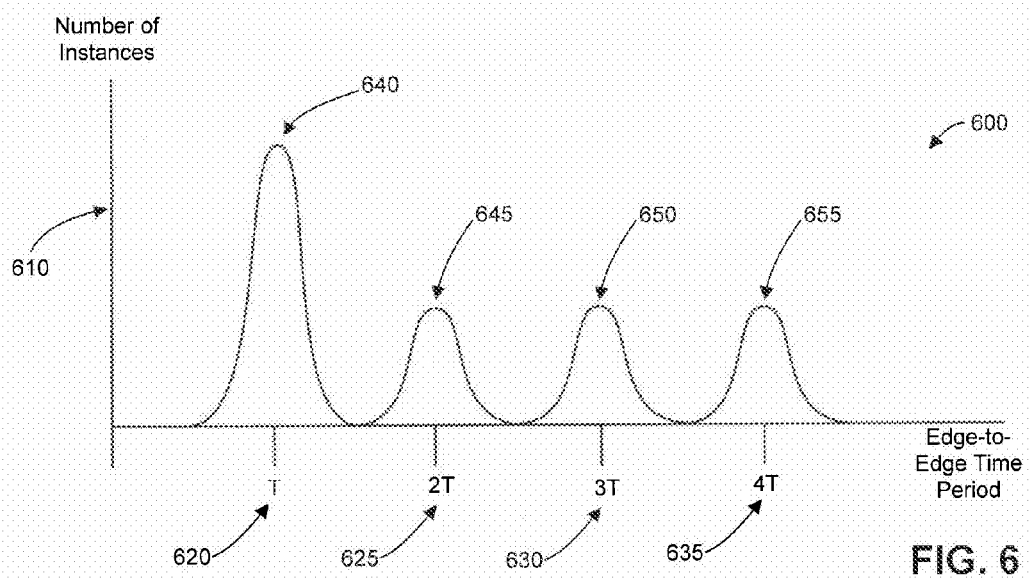
FIG. 6 illustrates an edge periodicity histogram according to an exemplary embodiment of the present disclosure.

The edge periodicity circuit 331 implements a frequency estimation scheme illustrated and described in FIGS. 5 and 6, to estimate the frequency of the incoming signal, for example at the output of the VGA 130 of FIG. 1. Briefly, the edge periodicity circuit 331 estimates the frequency of the signal by determining relationships between the time periods between transitions of the input signal. The CDR response circuit 335 uses an indication from the CDR circuit 150 that represents how close the frequency of the PLL is to the desired sample point of the slicer 135, and varies the frequency in a searching pattern until a desired sample point is reach. The frequency comparator circuit 336 receives, for example, a clock from a local PLL and a clock from another PLL to generate the correct desired frequency, for example based on a desired offset between a receive and transmit PLL.

Figure 3B:
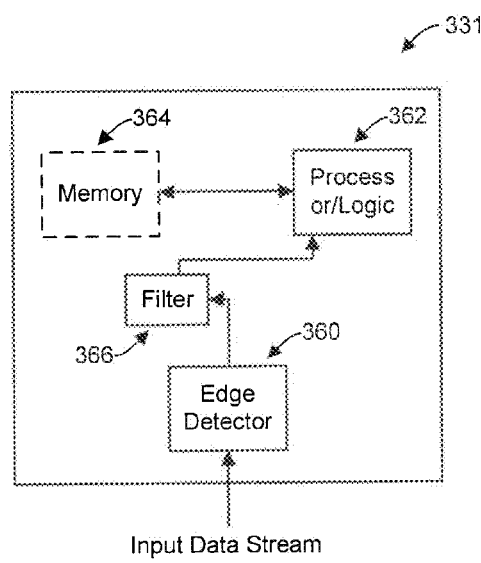
FIG. 3B illustrates a block diagram of an edge periodicity circuit for a phase locked loop according to an exemplary embodiment of the present disclosure.

FIG. 3B further illustrates one embodiment of the edge periodicity circuit 331. Referring to FIG. 3B, the edge periodicity circuit 331 can include an edge detector 360, processor and/or logic 362, and an optional memory 364. The edge detector 360 detects edge transitions and the corresponding time periods between the edge transitions of the input signal. For example, assuming the input signal is a data stream as will be illustrated below, the edge detector 360 may detect adjacent rising edge transitions or adjacent falling edge transitions, and the corresponding edge-to-edge time periods between edge transitions, where the corresponding time periods may be stored in a corresponding memory 364. As will be discussed in detail below, the processor 362 can determine a "unit time period" by analyzing the plurality of edge-to-edge time periods of the data stream. After which, the characteristic frequency of the data stream can be determined by inverting the unit time period.

FIG. 4 illustrates an edge counting frequency estimation scheme 400 for a signal having a high state 410 and low state 415. The signal transitions from the low state 415 to the high state 410, for example at time periods 420, 424, and 428. These transitions occur within time period 430. By counting the number of transitions within time period 430, for example in the edge counter circuit 330 of FIG. 3, the frequency of the signal is estimated by dividing the number of transitions by the time period 430. In some embodiments, the rising edge transitions from the low state 415 to the high state 410 are counted. In another embodiment, the falling edge transitions from the high state 410 to the low state 415 are counted and divided by the time period 430. In another embodiment, the total number of transitions between the high state 410 and low state 415 are measured over the time period 430. Embodiments employing this edge counting scheme depend on the transition density between the high state 410 and low state 415 averaging approximately 50 percent.

FIG. 5 illustrates an edge periodicity frequency estimation scheme 500 to estimate the frequency of a signal that transitions between a high state 510 and a low state 515 of a data stream 505. The signal transition density between the high state 510 and low state 515 may vary between 30 percent and 70 percent, resulting in a wider transition density range when compared to that of FIG. 4. In unscrambled data protocols, consecutive finite strings of "1" or "0" can occur in the data stream 505 at different proportions, making it challenging to detect the underlying frequency of the data stream.

Accordingly, the edge periodicity circuit 331 of FIG. 3 measures the effective time periods between edges of the data stream 505. In an embodiment, edge periodicity circuit 331 uses a clock having a frequency that is in the vicinity of the frequency of data stream 505 in making the measurements. For example, the edge periodicity circuit 331 of FIG. 3 detects first time period 520 between the first rising edge and the first falling edge in the data stream 505. Likewise, the edge periodicity circuit 331 detects a second time period 525 of between the first falling edge and the second rising edge, a third time period 520b between the second rising edge and the second falling edge, and a fourth time period 535 between the second falling edge and the third rising edge, and so on. Due to the periodic nature of the data signal, the differing time periods are a multiple of a shortest time period, herein known as a "unit time period" or "1T" for short, which happens to be equal to time period 520 in data stream 505. Accordingly, the various time periods identified between edge-to-edge transitions may be referred to as 1T, 2T, 3T, etc., where "1T" is the unit time period, and the others are multiples of the unit time period. Once the unit time period is determined for the data stream, then the underlying frequency of the data signal can be determined. As described further below, the number of instances of the various edge-to-edge time periods in the data signal 505 are counted and cataloged so that the unit time period can be recognized.

An alternate method exploits the fact that edge timing is at multiples of "1T", using analysis through a narrowband band pass filter tuned to the frequency of 1/T, which produces a tone at observed input data frequency. This tone may be used in an edge counter to count virtual transitions (input data bit times) in an observation interval determined by the local clock. It may also be shifted in frequency to create an error function for use in a closed adaptive loop. For example, as shown in FIG. 3B, a filter 366 may be placed at the output of edge detector 360. The output of filter 366 may be provided to processor 362, which computes a number of virtual transitions in an observation interval based on a local clock that is configured to be near the input data signal frequency.

FIG. 6 illustrates an edge periodicity histogram, in accordance with the scheme illustrated in FIG. 5. The histogram 600 illustrates the number of instances 610 of the various edge-to-edge time periods (e.g. 1T, 2T, 3T, 4T, etc.) from FIG. 5. Specifically, the histogram includes: the number of instances occurring at a unit time period 620 (e.g. "1T"), the number of instances occurring at twice the unit time period 625 (e.g."2T"), the number of instances occurring at three times the unit time period 630 (e.g."3T"), and the number of instances occurring at four times the unit time period 635 (e.g. "4T"). The histogram is then analyzed to determine that all the various time periods are a multiple of a unit time period "1 T", such that the peaks of the histogram occur at 1T, 2T=(2× 1T), 3T=(3×1T), 4T=(4×1T), etc. Stated another way, once all the various edge-to-edge time periods are accounted for in the data stream 505 and the histogram is formed, the corresponding "peaks" of the histogram 600 are located at multiples of the "unit time period." The information contained in the histogram is used to estimate the unit time period "1T" relative to the local clock.

Still referring to FIG. 6, the peaks of the histogram 600 can be understood to represent groupings of the individual edge-to-edge time periods, so that groups or subsets of the individual edge-to-edge time periods have a representative time period centered at the peaks of the histogram, (e.g. 1T, 2T, 3T, etc.) For example, the group of individual edge-to-edge time periods around "1T" in the histogram can be understood to be represented by "1T", the group of individual edge-to-edge time periods around "2T" can be understood to be represented by "2T", and so on. The reasons for the "spread" of individual edge-to-edge time periods around their corresponding representative time period (e.g. "1T", "2T", etc.) can be caused by channel noise, delay spread, measurement tolerance, among others. Each observation may be grouped to the nearest expected delay multiple. The edges counted with larger delays can be scaled by the delay multiple to account for missing transitions and summed. This provides an estimate of the "virtual transitions" or equivalently the number of bit times in the measurement interval, which corresponds to the frequency of the input signal relative to the local clocks.

Figure 7:
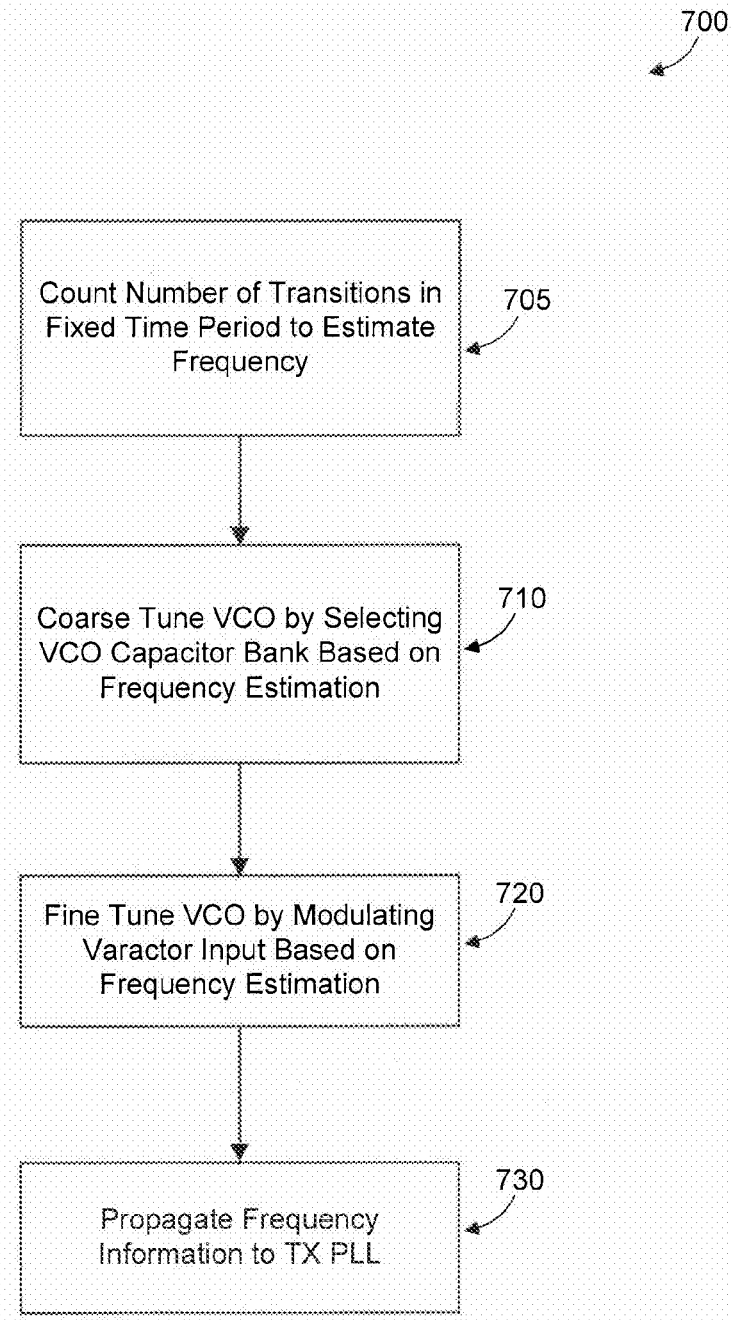
FIG. 7 is a flowchart of operational steps to estimate the frequency of a signal using an edge counting scheme and retime a signal using the estimated frequency.

In FIG. 7, the flowchart 700 includes step 705, wherein, the edge counter 330 counts the number of transitions or virtual transitions in a fixed time period to estimate the frequency of an input signal. Based on the estimated frequency at step 705, the control circuit 151 selects a capacitor bank 222 of FIG. 2 to coarse tune the frequency of the clock signal generated by the VCO 220. Furthermore, at step 720, the control circuit 151 generates an estimated frequency that causes the VCO 220 to fine tune the VCO by modulating a control signal of the varactor 221. At step 730, the fine tuned frequency from step 720 is propagated to a TX PLL 152 through a transmit control circuit 153, for example, to tune the TX PLL 152 more quickly with higher precision than would occur without the fine-tuned frequency information.

Figure 8A:
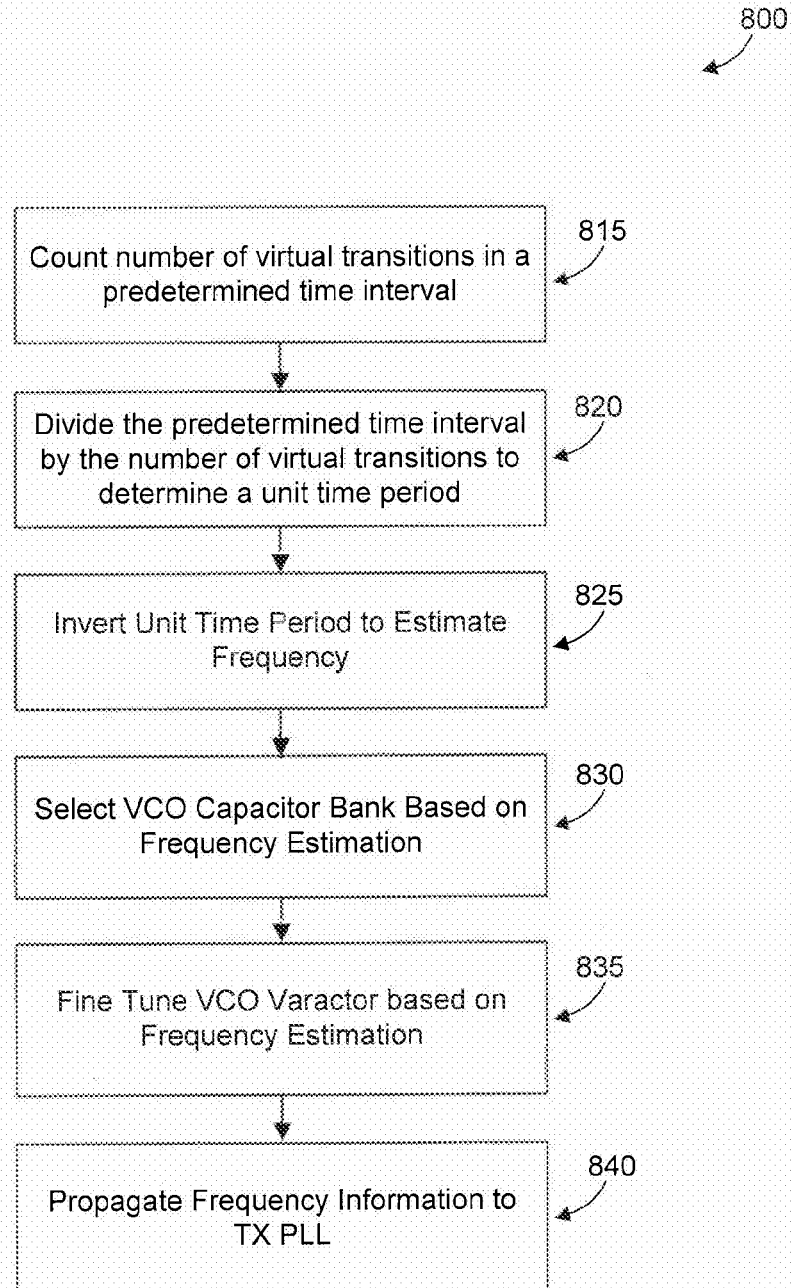
FIG. 8A is a flowchart of operational steps to estimate the frequency of a signal using an edge periodicity scheme and retime a signal using the estimated frequency.

FIG. 8A provides a flowchart 800 that further describes frequency estimation and VCO tuning according to one embodiment of the disclosure. Flowchart 800 begins in step 815, which includes, in an embodiment, the edge periodicity circuit 331 of FIG. 3 counting a number of virtual transitions in an incoming data signal in a predetermined time interval. Virtual transitions as used herein may correspond to time instances within the data signal at which one bit ends and a subsequent adjacent bit begins. A logic transition may or may not occur at these time instances, thus the naming as "virtual transitions." Since each virtual transition necessarily follows an input data bit time period, the number of virtual transitions and the number of input data bit times within a predetermined time interval are the same.

At step 820, in an embodiment, the edge periodicity circuit 331 divides the predetermined time interval by the number of virtual transitions counted in step 815 to determine a unit time period. In an embodiment, the unit time period is an estimate of the input data bit time period. Then, at step 825, the edge periodicity circuit 331 inverts the unit time period to estimate a frequency of the incoming data signal.

At step 830, the control circuit 151 selects the VCO capacitor bank based on the frequency estimation to coarse tune the VCO. The edge periodicity circuit 331 fine tunes the VCO by modulating the varactor of the VCO based on the frequency estimation at step 835. The control circuit 151 propagates the estimated frequency to the transmit PLL at step 840 to tune the transmit PLL.

Figure 8B:
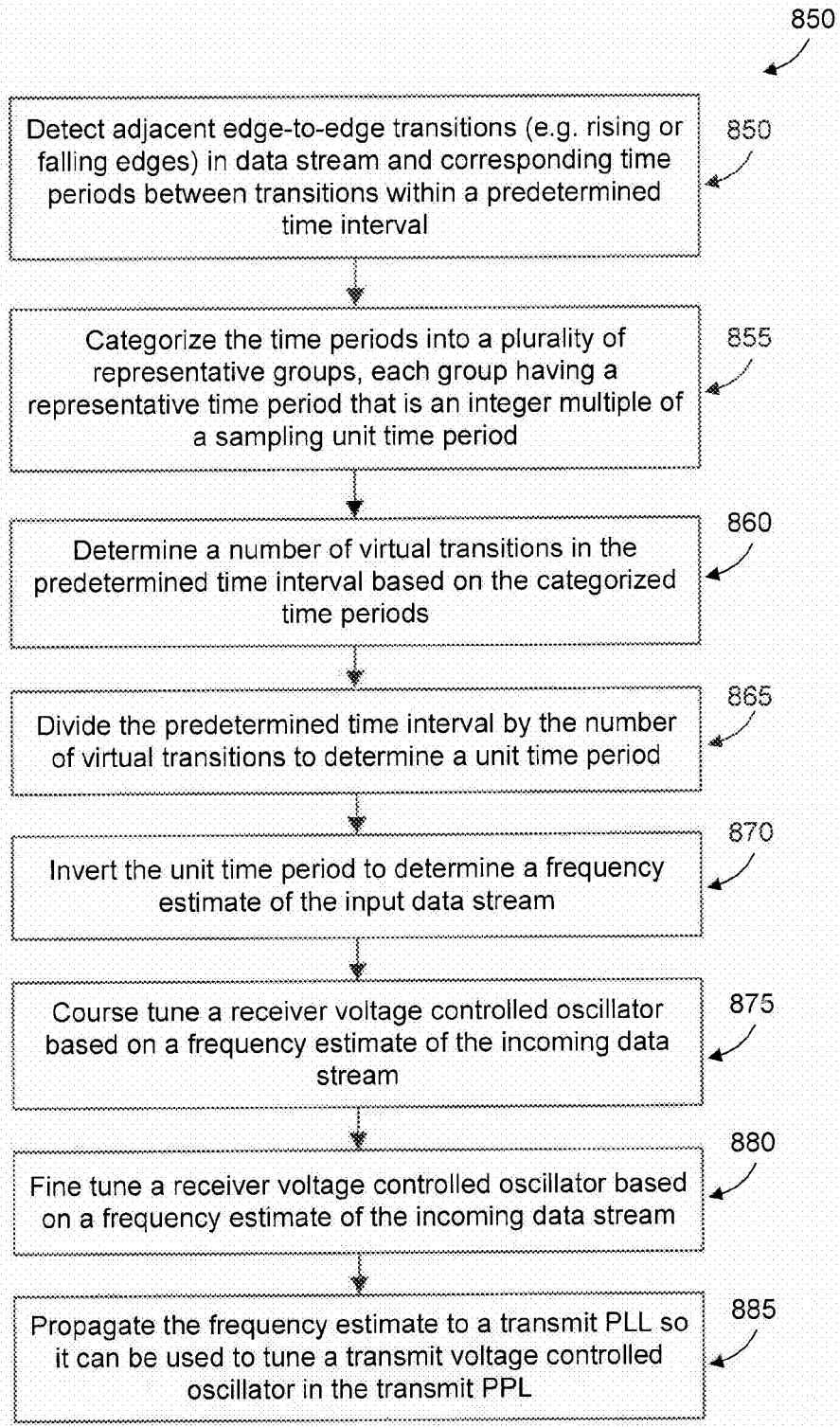
FIG. 8B is a flowchart of operational steps to estimate the frequency of a signal using an alternate edge periodicity scheme and retime a signal using the estimated frequency.

FIG. 8B provides a flowchart 850 that further describes frequency estimation and VCO tuning according to one embodiment of the disclosure. Flowchart 850 provides an alternate, but related, description of frequency estimation when compared to flowchart 800, and further refers to the elements in FIG. 3B.

In step 850, the edge detector 360 detects a number of edge-to-edge data transitions in an incoming data stream within a predetermined time interval, and determines the corresponding time periods between the detected edge-to-edge data transitions, which can be stored in an optional memory 364. Due to the periodic nature of the underlying frequency or clock of the incoming data stream, a finite number of different edge-to-edge transition time periods will result, where each edge-to-edge transition time period can be represented as a "unit time period," or an integer multiple of the unit time period. For example, referring to FIG. 5, the edge detector 360 detects the edge-to-edge data transitions within the shown predetermined time interval and then determines their corresponding time periods 520, 525, 520b, 535, 520c, 550, and 520d.

Figure 10:
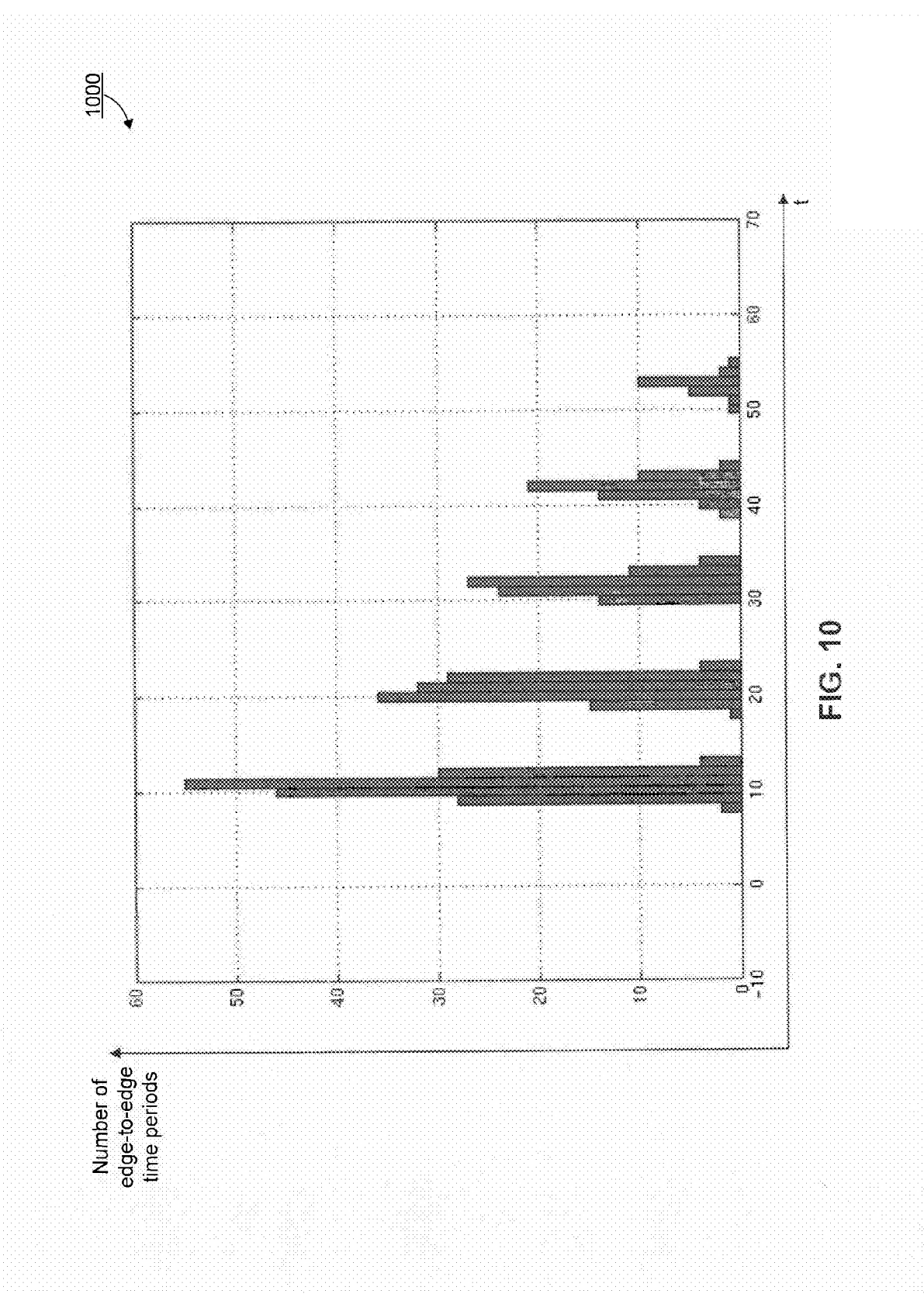
FIG. 10 illustrates an example histogram according to an embodiment.

At step 855, the processor 362 categorizes the time periods into a plurality of representative groups, each group having a representative time period that is an integer multiple of a sampling unit time period. The sampling unit time period is the period of a sampling clock at which rate the incoming data stream is sampled. The sampling clock is related to a local clock of the receiver. For example, the sampling clock can be equal to or a multiple of the local clock (e.g., 10 times the local clock). In an embodiment, the local clock can be initially configured to be near the frequency of the incoming data stream (e.g., within 5-10%). FIG. 10 illustrates an example histogram 1000 that can be generated in step 855 following the categorization of the time periods. Specifically, example histogram 1000 is generated using a sampling clock that is set to 10 times the local clock in order to oversample the incoming data stream. The determined time periods between detected edge-to-edge transitions form several groups centered at respective multiples of the sampling clock period. For example, the first group centered around the value "10" corresponds to edge-to-edge transitions that are approximately 10 times the sampling clock period apart from each other (or one time the local clock period) (with reference to FIG. 5, the first group may include time periods 520, 520b, 520c, and 520d); the second group centered around the value "20" corresponds to edge-to-edge transitions that are approximately twenty times the sampling clock period apart (or two times the local clock period) (with reference to FIG. 5, the second group may include time period 525); and so on. It is noted that if the local clock as configured is slow compared to the incoming data stream, then adjacent groups of time periods in histogram 1000 would appear closer to each other than 10 times the sampling clock period. Conversely, if the local clock as configured is fast compared to the incoming data stream, then adjacent groups of time periods in histogram 1000 would appear farther from each other than 10 times the sampling clock period, as shown in histogram 1000.

At step 860, the processor 362 determines a number of virtual transitions in the predetermined time interval based on the categorized time periods. In an embodiment, the processor 362 determines a respective count for each group of time periods, which corresponds to the number of time periods within the group. With reference to FIG. 5, the first group (corresponding to 1 local clock period) would receive a count equal to 4, and the second, third, and fourth groups (corresponding to 2 times, 3 times, and 4 times the local clock period respectively) would receive a count equal to 1 each. The processor 362 then multiplies the respective count of each group by its representative time period to generate a weighted count. For example, the processor 362 counts the number of time periods associated with the group centered around the value "10" in example histogram 1000 and then multiples this count by "1" because this group corresponds to time periods that are approximately equal to one local clock period. The processor 362 repeats this process for each group of example histogram 1000. The processor 362 determines the number of virtual transitions as the sum of all of the weighted counts. For example, with reference to FIG. 5, the processor 362 would determine the number of virtual transitions as the sum of 4*1+1*2+1*3+1*4, which is equal to 13.

Subsequently, in step 865, the processor 362 divides the predetermined time interval by the number of virtual transitions within the predetermined time interval to determine a unit time period. For example, with reference to FIG. 5, assume that the actual unit time period T is equal to 1 msec (i.e., the signal has 1 KHz frequency) and that the predetermined time interval accordingly is 15 msec long. The unit time period determined in step 865 would thus equal 1.5 msec divided by 13 or 1.15 msec. As would be understood by a person of skill in the art based on the teachings herein, in practice the predetermined time interval is selected to be significantly longer than the actual unit time period T so that the unit time period estimate converges to the actual unit time period.

At step 870, the processor 362 inverts the unit time period to determine a frequency estimate of the data stream.

At step 875, the control circuit 151 selects the VCO capacitor bank based on the frequency estimation to coarse tune the VCO. The edge periodicity circuit 331 fine tunes the VCO by modulating the varactor of the VCO based on the frequency estimation at step 880. The control circuit 151 propagates the frequency estimate of the incoming data stream to the transmit PLL at step 885 to tune the transmit PLL.

Figure 9:
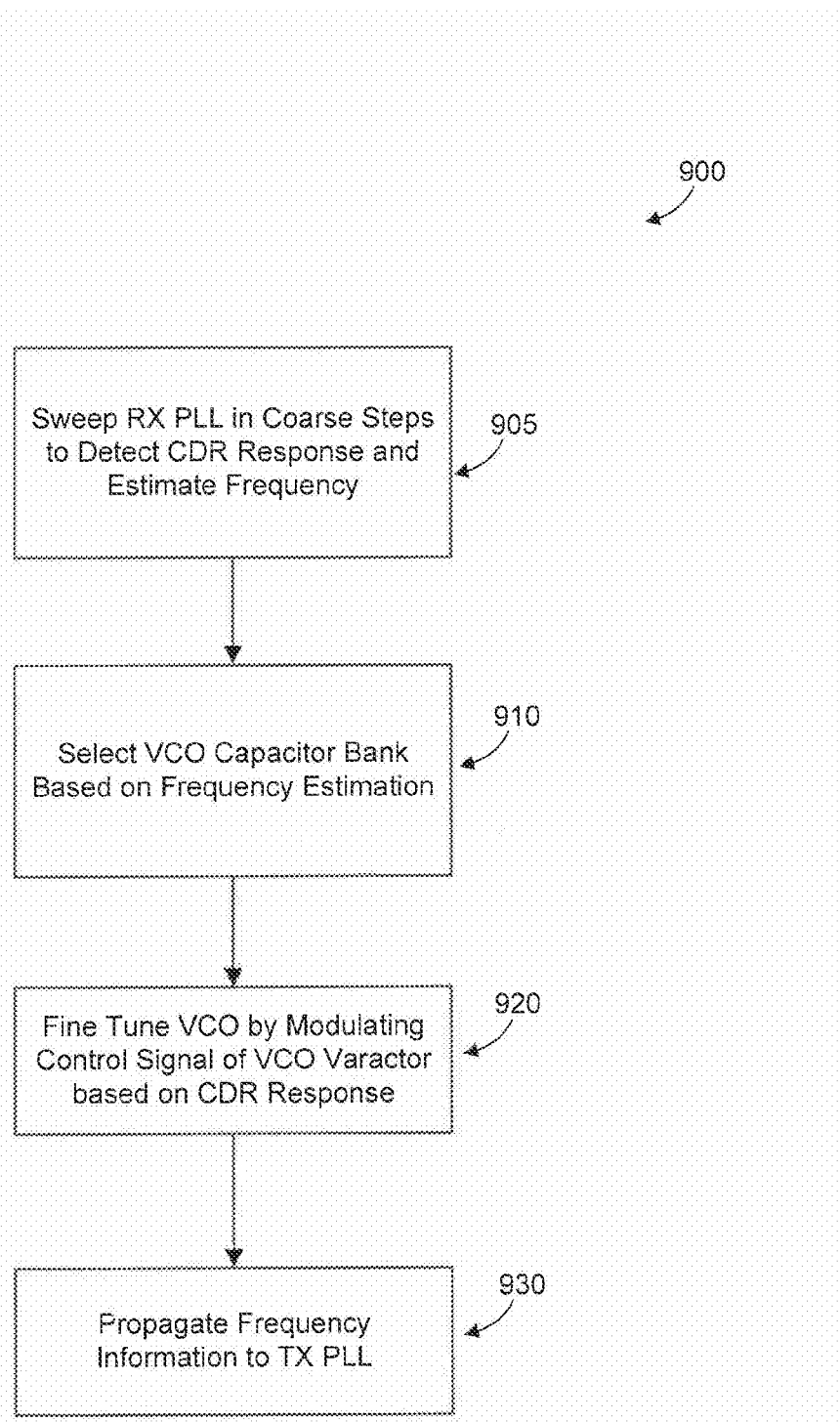
FIG. 9 is a flowchart of operational steps to estimate the frequency of a signal using a clock data recovery circuit response and retime a signal using the estimated frequency.

FIG. 9 provides a flowchart 900 that further describes frequency estimation and VCO tuning according to one embodiment of the disclosure. The flowchart 900 includes step 905, wherein the receive control circuit 151 sweeps the receive PLL 143 in coarse steps, and the response of the CDR 150 of FIG. 1, is measured in the CDR response circuit 335 to detect a response and estimate the frequency of the incoming signal. When, for example, the CDR response circuit 335 detects a response from the CDR, the receive control circuit 151 at step 910 selects the VCO capacitor bank corresponding to the estimated frequency. Likewise, the RX PLL is fine-tuned by modulating an input signal of a varactor of VCO using the response of the CDR measured by the CDR response circuit 335. Typical CDRs have weak responses when the frequency error is large, so this technique needs to employ a search algorithm with a fine resolution and is aided by prior methods first arrive near the correct frequency. The estimated frequency of step 920, at step 930 is propagated to the TX PLL to tune the TX PLL more quickly with higher precision than would occur without the fine tuned frequency information.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way. The exemplary embodiments described herein are provided for illustrative purposes, and are not limiting. Other exemplary embodiments are possible, and modifications may be made to the exemplary embodiments within the spirit and scope of the disclosure.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of storage devices. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

The disclosure has been described above with the aid of functional building blocks illustrating the implementation of specified functions and relationships thereof. The boundaries of these functional building blocks have been arbitrarily defined herein for the convenience of the description. Alternate boundaries may be defined so long as the specified functions and relationships thereof are appropriately performed. It will be apparent to those skilled in the relevant art(s) that various changes in form and detail can be made therein without departing from the spirit and scope of the disclosure.

What is claimed is:

1. A frequency estimation circuit, comprising:
   an edge detector configured to measure time periods between edge-to-edge transitions in a data stream within a predetermined time interval, resulting in a plurality of edge-to-edge time periods; and
   a processor configured to:
   categorize the plurality of edge-to-edge time periods into a plurality of representative groups, each representative group having a representative time period that is an integer multiple of a sampling unit time period;
   determine a number of virtual transitions in the predetermined time interval based on the categorized plurality of edge-to-edge time periods; and
   determine a frequency estimate of the data stream based on the number of virtual transitions in the predetermined time interval.

2. The frequency estimation circuit of claim 1, wherein the edge-to-edge transitions are rising edge transitions.

3. The frequency estimation circuit of claim 1, wherein the edge-to-edge transitions are falling edge transitions.

4. The frequency estimation circuit of claim 1, wherein the processor is further configured to:
   divide the predetermined time interval by the number of virtual transitions to determine a unit time period; and
   invert the unit time period to determine the frequency estimate of the data stream.

5. The frequency estimation circuit of claim 1, wherein the processor is further configured to:
   determine a respective count for a representative group of the plurality of representative groups, the respective count corresponding to a number of edge-to-edge time periods associated with the representative group; and
   multiply the respective count by the representative time period of the representative group to generate a respective weighted count for the representative group.

6. The frequency estimation circuit of claim 5, wherein the processor is further configured to generate a respective weighted count for each of the remaining ones of the plurality of representative groups.

7. The frequency estimation circuit of claim 6, wherein the processor is further configured to determine the number of transitions as a sum of the respective weighted counts of the plurality of representative groups.

8. A frequency estimation circuit, comprising:
   an edge detector configured to measure time periods between edge-to-edge transitions in a data stream, resulting in a plurality of edge-to-edge time periods that are stored in a memory; and
   a processor, coupled to the memory, configured to:
   categorize the plurality of edge-to-edge time periods into a plurality of representative groups, each representative group having a representative time period;
   determine a unit time period based on the representative time periods of the plurality of representative groups; and
   invert the unit time period to determine a frequency of the data stream.

9. The frequency estimation circuit of claim 8, wherein the unit time period corresponds to a shortest time period among the representative time periods of the plurality of representative groups.

10. The frequency estimation circuit of claim 8, wherein the representative time period of each representative group is an integer multiple of a period of a sampling clock.

11. The frequency estimation circuit of claim 8, wherein the edge detector is configured to measure the time periods between edge-to-edge transitions relative to the sampling clock.

12. A communications device, comprising:
   a receiver comprising:
   a frequency estimation circuit, configured to:

count a number of edge-to-edge transitions in an input data stream in a predetermined time period; and divide the number of edge-to-edge transitions by a number of bit intervals within the predetermined time period to determine a frequency estimate of the input data stream;

a receive voltage controlled oscillator, configured to coarse tune a receive oscillator signal based on the frequency estimate;

a slicer configured to sample the input data stream based on a slicer input clock, and provide slicer output data; and a clock and data recovery module configured to generate the slicer input clock based on the receive local oscillator signal and the slicer output data.

13. The communications device of claim 12, wherein the clock and data recovery module is further configured to adjust a sample time of the slicer based on the slicer output data.

14. The communications device of claim 12, wherein the frequency estimation circuit estimates the number of bit intervals within the predetermined time period based on a priori knowledge of a transition density of the input data stream.

15. The communications device of claim 12, further comprising a transmit circuit that is coupled to the receiver, and configured to regenerate sample output data from the slicer output data, and transmit the sample output data over an associated communications link.

16. The communications device of claim 15, wherein the transmit circuit comprises:

a transmit voltage controlled oscillator configured to provide a transmit oscillator signal to clock the regeneration of the sample output data; and a control circuit, configured to receive the frequency estimate from the receiver and tune the transmit oscillator signal based on the frequency estimate.

17. The communications device of claim 12, wherein the receive voltage controlled oscillator includes a capacitor bank and a varactor diode, wherein the capacitor bank is used to coarse tune the receive oscillator signal based on the frequency estimate of the input data stream.

18. The communications device of claim 17, wherein the receive voltage controlled oscillator forms part of a phase lock loop, the phase lock loop comprising:

a phase detector configured to compare a phase of the receive oscillator signal with that of a reference signal and generate a control signal based on the comparison, wherein the control signal is used to fine tune the varactor diode of the receive voltage controlled oscillator.

19. The communications device of claim 12, wherein the edge-to-edge transitions are rising edge transitions.

20. The communications device of claim 12, wherein the edge-to-edge transitions are failing edge transitions.

* * * * *